United States Patent

Higashino

(10) Patent No.: US 8,069,386 B2
(45) Date of Patent: Nov. 29, 2011

(54) SEMICONDUCTOR DEVICE

(75) Inventor: Kaoru Higashino, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 51 days.

(21) Appl. No.: 12/644,896

(22) Filed: Dec. 22, 2009

(65) Prior Publication Data

US 2010/0162056 A1    Jun. 24, 2010

(30) Foreign Application Priority Data

Dec. 23, 2008   (JP) .................................. 2008-326649

(51) Int. Cl.
*G06F 11/00* (2006.01)
*G01R 31/28* (2006.01)
*G01R 31/3187* (2006.01)

(52) U.S. Cl. .................... 714/733; 714/30; 324/750.3
(58) Field of Classification Search .................. None
See application file for complete search history.

(56) References Cited

U.S. PATENT DOCUMENTS

| 7,146,547 | B2 * | 12/2006 | Fukatsu ........................ | 714/718 |
| 7,484,141 | B2 * | 1/2009 | Shikata ......................... | 714/718 |
| 7,707,466 | B2 * | 4/2010 | Gupta et al. .................. | 714/718 |
| 2003/0016578 | A1 * | 1/2003 | Janik et al. ................... | 365/201 |
| 2004/0120181 | A1 * | 6/2004 | Fukatsu ......................... | 365/154 |
| 2004/0230395 | A1 * | 11/2004 | Basto ............................. | 702/117 |
| 2005/0193293 | A1 * | 9/2005 | Shikata ......................... | 714/718 |
| 2007/0204190 | A1 * | 8/2007 | Hesse et al. .................... | 714/718 |
| 2008/0253208 | A1 * | 10/2008 | Yamaguchi et al. .......... | 365/201 |

FOREIGN PATENT DOCUMENTS

JP   2006-155682 A   6/2006

OTHER PUBLICATIONS

IEEE Journal of Solid-State Circuits, vol. 33, No. 11, Nov. 1998 1731 Processor-Based Built-In Self-Test for Embedded DRAM Jeffrey Dreibelbis, Member, IEEE, John Barth, Howard Kalter, Fellow, IEEE, and Rex Kho.*

* cited by examiner

*Primary Examiner* — Jeffrey A Gaffin
*Assistant Examiner* — Guerrier Merant
(74) *Attorney, Agent, or Firm* — Foley & Lardner LLP

(57) ABSTRACT

A semiconductor device includes a CPU, a memory, a memory BIST circuit, a first selector that selects and outputs an address and control signal from the memory BIST circuit, when performing a test using the memory BIST circuit, and selects and outputs an address and control signal of the CPU when not performing a test using the memory BIST circuit, a second selector that selects and outputs write data from the memory BIST circuit when performing a test using the memory BIST circuit, and selects and outputs write data of the CPU when not performing a test using the memory BIST circuit, a first flip-flop that samples an output of the first selector (11) and a second flip-flop that samples an output of the second selector. An address and control signal and write data output from the first and second flip-flops are supplied to an address and control terminal and a write data terminal of the memory.

5 Claims, 3 Drawing Sheets

FIG. 2  REFERENCE CASE

SEMICONDUCTOR DEVICE

TECHNICAL FIELD

Reference to Related Application

This application is based upon and claims the benefit of the priority of Japanese patent application No. 2008-326649, filed on Dec. 23, 2008, the disclosure of which is incorporated herein in its entirety by reference thereto.

The present invention relates to a semiconductor device, and in particular, to a semiconductor device with one or more memories provided therein.

BACKGROUND

When a plurality of memories provided on one chip of a semiconductor device are tested (self-tested) by a memory BIST (Built-In Self-Test) circuit provided on the same chip as the memories, there is some memories located far apart from the memory BIST circuit with regard to layout. The memory BIST circuit performs testing by generating and forcing a test vector comprising an address signal, control signals, and a write data to the memories under test and comparing read data from the memories under test with the write data.

When the memory located far apart from the memory BIST circuit is tested in the same way as a memory located close to the memory BIST circuit, timing margin in testing of the distant memory becomes tight due to wiring delay.

In Patent Document 1 (JP Patent Kokai Publication No. JP-P2006-155682A), when testing a plurality of memories provided in an LSI (Large Scale Integrated Circuit) using a memory BIST control circuit (referred to as a "memory BIST circuit"), a configuration shown in FIG. 3 is disclosed as an LSI test circuit for avoiding the above mentioned timing problems and carrying out an at-speed test, without depending on layout location relationships between the memory control BIST circuit and each of the memories. According to respective placement positions of memories 102 and 105, pipeline flip-flops 107 and 108 that when carrying out a memory BIST, delay a signal are inserted in a path connecting the memories to the memory BIST control circuit 106. For the memory 105 disposed at a location separated from the memory BIST control circuit 106 according to the configuration of the LSI circuit, signals between the memory and the memory BIST control circuit 106 are pipelined by the pipeline flip-flops 107 and 108, and a comparison is made of a test result at a timing that gives consideration to the number of pipeline stages in the memory control BIST circuit 106.
[Patent Document 1]
JP Patent Kokai Publication No. JP-P2006-155682A (FIG. 1)

SUMMARY

The following analysis of the related art is given by the present invention.

The configuration shown in FIG. 3 is summarized as follows.

(A) A selector 104 that performs switching of a path to the memory BIST control circuit 106 is arranged just before the memory 105.

(B) The pipeline flip-flops 107 and 108 are arranged between the selector 104 and the memory BIST control circuit 106.

(C) Even in case that the memory 105 and the memory BIST control circuit 106 are arranged at physically distant (with regard to layout) positions, the timing for a memory disposed at a distant position, does not become tight, due to the pipeline flip-flops 107 and 108. As a result, access timing for the memory arranged at a distant position from the memory BIST control circuit 106 is relaxed.

However, in the configuration shown in FIG. 3, only the memory 105 can be tested when a speed test of the memory 105 is performed using the memory BIST control circuit 106, and it is not possible for the memory BIST circuit to perform a speed of an access path between the memory 105 and a flip-flop (not shown) for accessing the memory 105 in a user logic circuit 101. As a result, it is necessary to perform a speed test (an at-speed functional test) of the access path between the memory 105 and the flip-flop (not shown) which accesses the memory in the user logic circuit 101, by another means (a detailed analysis is given in the description of a comparative example). As a result, a test pattern (LSI test pattern) is required in order to perform a speed test of a path between the memory and the flip-flop which accesses the memory.

The present invention which seeks to solve one or more of the abovementioned problems, may be summarized as follows.

According to the present invention, there is provided a semiconductor device including a memory; a memory BIST (Built-In Self-Test) circuit that performs a test of the memory; and a CPU (Central Processing Unit). The CPU includes a flip-flop that samples a signal for accessing the memory and outputs the sampled signal; and a selector arranged at a stage preceding to the flip-flop. The selector selects one of a signal for accessing the memory from the memory BIST circuit and a signal for accessing the memory generated by the CPU. The signal for accessing the memory selected by the selector is supplied to the flip-flop.

According to the present invention, there is provided a test method of a semiconductor device, the method comprising:

arranging a selector that performs switching of a path to a memory BIST (Built-In Self-Test) circuit, just before a flip-flop that samples and outputs a signal for accessing a memory, and testing the memory and testing a path for access to the memory, by the memory BIST circuit.

According to the present invention, it is possible to perform a speed test of an access path between a memory and a flip-flop for accessing the memory, by a memory BIST circuit.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

In the present invention, there is provided selectors (11 and 12 in FIG. 1) that perform switching of a path from a memory BIST circuit (2), just before flip-flops (13 and 14 in FIG. 1) which are used to access a memory (3). A speed test of each path between the memory (3) and the flip-flops (13 and 14) that access the memory can be executed by a memory BIST (2). As a result, in the present invention there is no need to create a test pattern in order to test the path between the memory and the flip-flops that access the memory.

Figure 2:
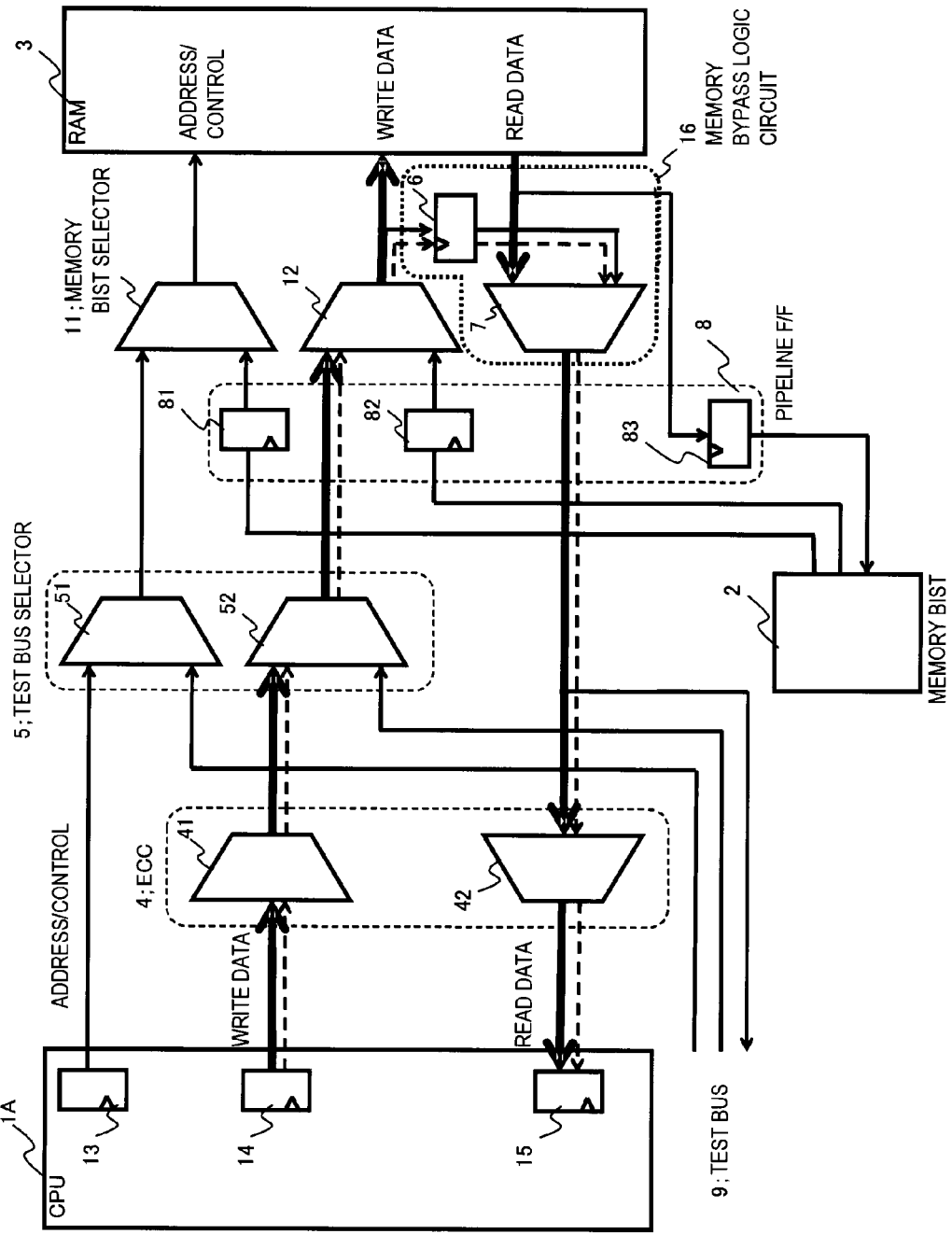
FIG. 2 is a diagram showing a configuration of a reference case (comparative example).

A reference case will be described below as a comparative example of the present invention with reference to FIG. 2, which is a diagram showing the reference case and which is created by the present inventor in order to provide better understanding of the present invention. In FIG. 2, a CPU 1A includes a flip-flop 13 that holds an address/control signal, a flip-flop 14 that holds write data for RAM (random access memory) 3, and a flip-flop 15 that holds read data which has been read from the RAM 3. The write data output from the flip-flop 14 of the CPU 1A is ECC (Error Checking and Correction) encoded by an ECC encoding circuit 41 of an ECC circuit 4. In FIG. 2, the flip-flop 13 is shown as a flip-flop supplied with one line, only for simplicity's sake. The flip-flop in FIG. 2 is configured as a plurality of flip-flops (register) for sampling plural parallel bits of an address signal responsive to a clock (not shown in the drawing). In FIG. 2, the address and control signal is combined into one signal, but a control signal (including a control signal for specifying read, write access and the like) may have a different terminal from an address signal terminals, and may be transferred on a wiring path different from the address signal. In case that the flip-flops 14 and 15 transfer multi-bit data in parallel, a plurality of flip-flops (registers) are configured in which multi-bit write data (parallel data) and multi-bit read data (parallel data) are sampled responsive to a clock not shown in the drawing.

A test bus selector 51 includes a selector 51 that receives an address/control signal from the flip-flop 13 and an address/control signal on a test bus 9, and a selector 52 that receives an output of the ECC (Error Checking and Correction) encoding circuit 41 of the ECC circuit 4 and write data on the test bus 9. The address/control signal and the write data on the test bus 9 are supplied by an LSI tester (not shown in the drawing), when a test is performed. The selector 51 selects an address/control signal (test pattern) on the test bus 9, when a test using the test bus 9 is performed by a test mode signal (not shown in the drawing), and selects an address/control signal from the flip-flop 13, in other cases, for example, in a normal operation and in a test mode in which a test is performed without using the test bus 9. In the same way, the selector 52 selects write data (test pattern) on the test bus 9 when performing a test using the test bus 9, by a test mode signal (not shown in the drawing) and selects an output of the ECC encoding circuit 41 in other cases, for example, in a normal operation and in a test mode in which a test is performed without using the test bus 9. The ECC encoding circuit 41 performs ECC (Error Correction Code) encoding of the write data from the CPU 1A, and outputs the encoded result.

A memory BIST selector 11 (also referred to simply as "selector 11") receives an output of the selector 51 and an output of a pipeline flip-flop 81 that receives an address/control signal from the memory BIST circuit 2, selects an output of the pipeline flip-flop 81, when performing a test using the memory BIST circuit 2 and selects an output of the selector 51 in other cases, for example in a normal operation and in a test mode in which a test using the test bus 9 is performed. An output of the memory BIST selector 11 is supplied to an address/control signal terminal of the RAM 3.

A memory BIST selector 12 (also referred to simply as "selector 12") receives an output of the selector 52 and an output of a pipeline flip-flop 82 that receives write data from the memory BIST circuit 2, selects an output of the pipeline flip-flop 82, when performing a test using the memory BIST circuit 2, and selects an output of the selector 52 in other cases, for example, in a normal operation and in a test mode in which a test using the test bus 9 is performed. An output of the memory BIST selector 12 is supplied to a write data terminal.

A selector 7 receives read data output from a read data terminal of the RAM 3 and an output (bypass output) of a flip-flop 6 that receives write data output from the memory BIST selector 12, selects an output of the flip-flop 6 in case of a bypass mode in which the RAM 3 is bypassed, such as in a scan path test, and selects read data output from the read data terminal of the RAM 3 in other cases.

Read data output from the read data terminal of the RAM 3 is supplied directly to the pipeline flip-flop 83. An output of the flip-flop 83 is supplied to an output to the memory BIST selector 12.

An ECC decoding circuit 42 of the ECC circuit 4 receives an output of the selector 7, and performs ECC decoding (error checking and correction).

The flip-flop 15 of the CPU 1A samples an output of the ECC decoding circuit 42.

Figure 3:
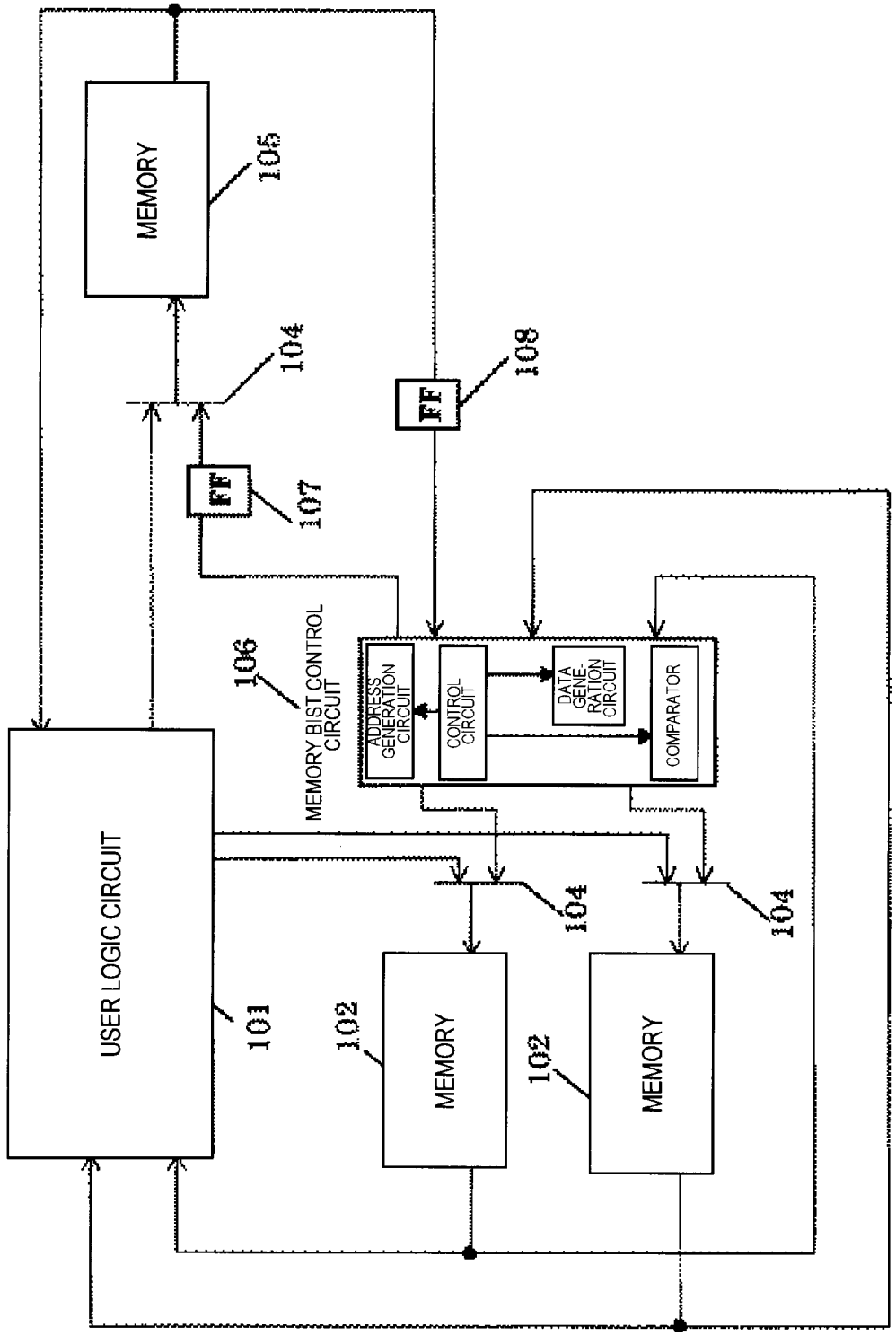
FIG. 3 is a diagram showing a configuration of Patent Document 1.

The flip-flops 81 and 82 (pipeline flip-flops) in FIG. 2 correspond to a flip-flop 107 in FIG. 3, and the flip-flop 83 corresponds to the flip-flop 108 of FIG. 3. In FIG. 2, the semiconductor device is equipped with ECC function, but the ECC circuit 4 may be dispensed with. In case that the ECC circuit 4 is omitted, an output of the flip-flop 14 is supplied directly to the selector 52, and an output of the selector 7 is supplied directly to the flip-flop 15.

In a normal operation, an address/control signal from the flip-flop 13 in the CPU 1A is supplied to an address/control terminal of the RAM 3 via the selector 51 and the selector 11. Write data from the flip-flop 14 in the CPU 1A is supplied to a write data terminal of the RAM 3 via the ECC encoding circuit 41, the selector 52 and the selector 12.

The read data of a memory cell in the RAM 3 which is selected by an address of the address/control signal is sampled by the flip-flop 15 of the CPU 1A via the selector 7 and the ECC decoding circuit 42.

When performing a test using the test bus 9, the address/control signal (test pattern) on the test bus 9 is supplied to an address/control terminal of the RAM 3 via the selector 51 and the selector 11. The write data (test pattern) on the test bus 9 is supplied to a write data terminal of the RAM 3 via the selector 52 and the selector 12. The read data of a memory cell in the RAM 3 which is selected by an address signal on the test bus 9 is transferred to read data on the test bus 9 via the selector 7.

When performing a speed test using the memory BIST circuit 2, an output of the pipeline flip-flop 81 is selected by the selector 11, an output of the pipeline flip-flop 82 is selected by the selector 12, and the address/control signal and the write data from the memory BIST circuit 2 are applied to the RAM 3. In this case, the read data of the RAM 3 is sampled by the pipeline flip-flop 83 and given to the memory BIST circuit 2.

When a scan path test or a BIST test is employed, the RAM 3 is bypassed by memory bypass logic circuit formed of the flip-flop 6 and the selector 7. That is, when a bypass is performed, the read data of the RAM 3 is ignored, and data obtained by capturing output of the selector 12 by the flip-flop 6 is selected by the selector 7.

When a speed test is performed on a path (path of the flip-flop 14-->the ECC encoding circuit 41-->the selector 52-->the selector 12-->the RAM 3 write data terminal and the RAM 3 read data terminal-->the selector 7-->the ECC decoding circuit 42-->the flip-flop 15) between the flip-flops 14 and 15 that access memory and the RAM 3, it becomes necessary to prepare a test pattern that is different from a test pattern that uses the memory BIST circuit 2. That is, using the memory BIST circuit 2, it is not possible to test the path between the flip-flops 14 and 15 that access memory and the RAM 3. Therefore, a speed test is performed by an LSI tester which supplies a test pattern that sets address/control signal for testing and write data for testing to the flip-flops 13 and 14 via an internal circuits in the CPU 1A, performs selection of test bus selectors 51 and 52 and selection of memory BIST selectors 11 and 12, and sets selection of the selector 7 so as to input read data from the RAM 3 to the flip-flop 15.

According to the present invention, there are provided selectors (memory BIST selectors) (11 and 12), each of which selects one of a signal from a memory BIST circuit (2) and a signal generated by a CPU (1), and is arranged at a stage preceding to each of flip-flops (13 and 14) that access a memory (RAM 3). A detailed description of an exemplary embodiment will be given in the below.

Figure 1:
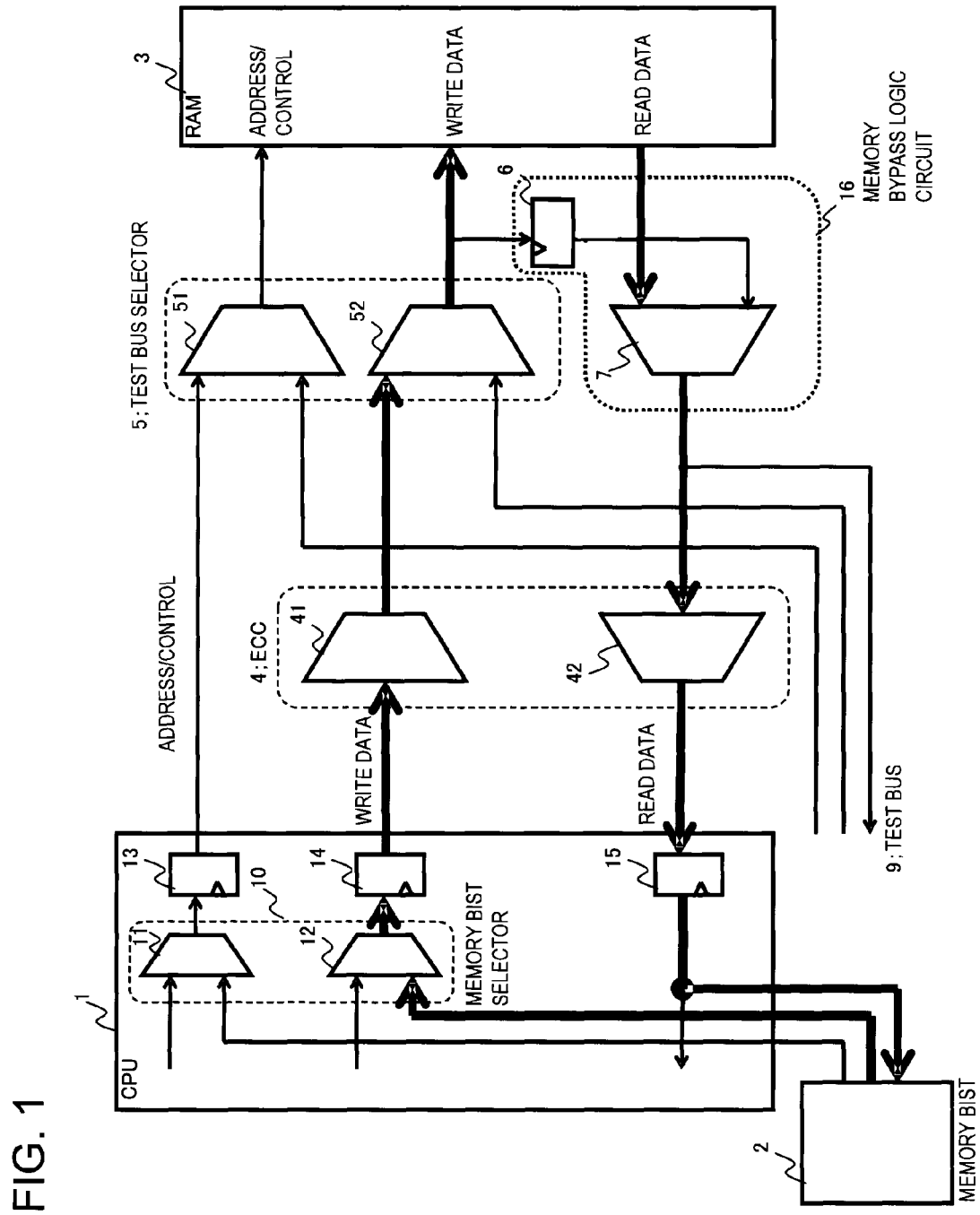
FIG. 1 is a diagram showing a configuration of one exemplary embodiment of the present invention.

FIG. 1 is a diagram showing a configuration of an exemplary embodiment of the present invention. Referring to FIG. 1, in the present exemplary embodiment, the semiconductor device comprises a RAM 3, a CPU 1, an ECC circuit 4 that includes an ECC encoding circuit 41 and an ECC decoding circuit 42, a test bus selector 5 that includes selectors 51 and 52, a memory bypass logic circuit 16 that includes a flip-flop 6 and a selector 7, and a memory BIST circuit 2. The CPU 1 includes flip-flops 13, 14, and 15 that access the RAM 3, and a memory BIST selector 10 that includes a selector 11 and a selector 12, each of which is arranged at a stage preceding to each of the flip-flops 13 and 14. In FIG. 1, the flip-flops 13 and 14, the ECC circuit 4, the test bus selector 5, the memory bypass logic circuit 16, the RAM 3, and the memory BIST circuit 2 are respectively the same as the corresponding ones in FIG. 2.

The selector 11 of the memory BIST selector 10 in the CPU 1 receives an address/control signal generated by an internal circuit (not shown) of the CPU 1, and an address/control signal output from the memory BIST circuit 2, selects the address/control signal from the memory BIST circuit 2 when performing a test using the memory BIST circuit 2, and selects the address/control signal from the internal circuit of the CPU 1 in other cases. The address/control signal selected by the selector 11 is sampled by the flip-flop 13.

The selector 12 of the memory BIST selector 10 in the CPU 1 receives write data generated by an internal circuit of the CPU 1, and write data from the memory BIST circuit 2, selects the write data from the memory BIST circuit 2 when performing a test using the memory BIST circuit 2, and selects the write data from the internal circuit of the CPU 1 in other cases. The write data selected by the selector 12 is sampled by the flip-flop 14. An output of the flip-flop 14 is supplied to the ECC encoding circuit 41 of the ECC circuit 4.

The selector 51 receives an output of the flip-flop 13 and an address/control signal on the test bus 9, selects the address/control signal on the test bus 9 when performing a test using the test bus 9, and selects the output of the flip-flop 13 in other cases, for example, in normal operation and in a test mode in which a test using the memory BIST circuit 2 is performed.

The selector 52 receives an output of the ECC encoding circuit 41 and write data on the test bus 9, selects the write data on the test bus 9, when performing a test using the test bus, and selects the output of the flip-flop 14 in other cases, for example, in normal operation, and in a test mode in which a test using the memory BIST circuit 2 is performed.

Outputs of the selectors 51 and 52 are supplied respectively to an access control signal terminal and a write data terminal of the RAM 3. When a memory bypass is performed, such as in a scan path test, in which the write data to the RAM 3 is bypassed and loop-backed at the flip-flop 6 arranged in front of the RAM 3, the output of the selector 52 is sampled by the flip-flop 6 forming the memory bypass logic circuit 16 and an output of the flip-flop 6 is supplied to one input end of the selector 7. The selector 7 receives read data output from the RAM 3 at another input end thereof and selects the output of the flip-flop 6 when the memory bypass is performed, and selects the read data from the RAM 3 in other cases.

The output of the selector 7 is supplied to the ECC decoding circuit 42 of the ECC circuit 4, which performs error correction decoding processing. The output of the ECC decoding circuit 42 is sampled by the flip-flop 15 in the CPU 1. The output of the flip-flop 15 is supplied to the internal circuit (not shown) in the CPU 1 and to the memory BIST circuit 2.

In the present exemplary embodiment, in the CPU 1 includes the memory BIST selectors 11 and 12 arranged respectively at stages preceding to the flip-flops 13 and 14 that access the RAM 3.

In FIG. 1, in order to simplify the description, the configuration of a semiconductor device including one memory (RAM 3) is shown. However, it is as a matter of course that the present invention may also be applied to such a configuration of a semiconductor device which includes a plurality of memories, as in FIG. 3. In the semiconductor device including a plurality of memories, the flip-flops 13 and 14 function as pipeline flip-flops, and for a memory that is distant from the memory BIST circuit 2, at least one flip-flop (pipeline flip-flop) is further provided between each of the flip-flop 13 and the selector 51, the flip-flop 14 and the selector 52, and the selector 7 and the flip-flop 15.

The operation of the present exemplary embodiment will now be described.

In a normal operation, access to the RAM 3 is performed by the flip-flops 13 and 14 that access the memory (RAM 3) in the CPU 1. The selector 11 selects an address signal and a control signal generated by an internal circuit (not shown) in the CPU 1, and an output of the flip-flop 13 is supplied to an address/control terminal of the RAM 3, via the selector 51. The selector 12 selects write data generated by an internal circuit (not shown) in the CPU 1, and an output of the flip-flop 14 is supplied to a write data terminal of the RAM 3, via the ECC encoding circuit 41 and the selector 52. Read data from the RAM 3 is supplied to an internal circuit (not shown) in the CPU 1 via the selector 7, the ECC decoding circuit 42, and the flip-flop 15 of the CPU 1.

When performing a test such as a scan path test, the RAM 3 is bypassed by the memory bypass logic circuit 16, and a test of a write access path to the RAM 3 and a test of a read access path from the RAM 3 are performed between the flip-flop 14 and the flip-flop 6, and between the flip-flop 6 and the flip-flop 15.

When performing a self test (speed test) using the memory BIST circuit 2, the flip-flops 13, 14, and 15 that access the RAM 3 are used as pipeline flip-flops, and a test of the RAM 3 is performed by the memory BIST circuit 2. That is, the address/control signal generated by the memory BIST circuit 2 is supplied to an address/control terminal of the RAM 3 via a path of the memory BIST circuit 2-->the selector 11-->the flip-flop 13-->the selector 51.

The write data generated by the memory BIST circuit 2 is supplied to a write data terminal of the RAM 3 via a path of the memory BIST circuit 2-->the selector 12-->the flip-flop 14-->the ECC encoding circuit 41-->the selector 52.

In the self test using the memory BIST circuit 2, the read data from the RAM 3 is supplied to the memory BIST circuit 2 via a path of the read data terminal of the RAM 3-->the selector 7-->the ECC decoding circuit 42-->the flip-flop 14.

When performing a test using the test bus 9, the address/control signal (test pattern) on the test bus 9 is supplied to an address/control terminal of the RAM 3 via the selector 51. The write data (test pattern) on the test bus 9 is supplied to a write data terminal of the RAM 3 via the selector 52. The read data of a memory cell in the RAM 3 which is selected by an address signal on the test bus 9 is transferred to the test bus 9 via the selector 7.

As described above, according to the present exemplary embodiment, when performing a test of the RAM 3 by the memory BIST circuit 2, the test of the RAM 3 is carried out via the flip-flops 13, 14 and 15 that access the memory. As a result, a speed test can be performed using the memory BIST circuit 2, even for a path between the RAM 3 and each of the flip-flop 13, 14, 15 that access the RAM 3.

In the present exemplary embodiment, since the speed test of an access path between the RAM 3 and each of the flip-flops 13, 14 and 15 that access the RAM 3 can be performed by the self test using the memory BIST circuit 2, there is no need to separately execute a speed test using an LSI tester or the like.

As described above, according to the present invention, since it is possible to execute a speed test between a memory and each of flip-flops that access the memory by the test using the memory BIST circuit, there is no need to separately execute the speed test by an LSI tester, thereby reducing total test time. Further, there is an advantageous effect in that a step of preparing a test pattern for a speed test between the memory and each of the flip-flops that access the memory is not necessary.

Each disclosure of Patent Document 1 described above is incorporated herein by reference. Modifications and adjustments of the exemplary embodiment and the examples are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A semiconductor device comprising:
   a memory;
   a memory BIST (Built-In Self-Test) circuit that performs a test of the memory; and
   a CPU (Central Processing Unit) that includes:
      a selector; and
      a flip-flop that receives and samples a signal output from the selector for accessing the memory to output the sampled signal for supply to the memory,
      wherein the selector is arranged at a stage preceding to the flip-flop, the selector receiving a first signal for accessing the memory output from the memory BIST circuit and a second signal for accessing the memory generated by the CPU and selecting one of the first and second signals received, the signal selected by the selector being supplied to the flip-flop,
   wherein the selector comprises:
      a first selector that selects and outputs an address and control signal generated by the memory BIST circuit, when a test using the memory BIST circuit is performed, and selects and outputs an address and control signal generated by the CPU, when the test using the memory BIST circuit is not performed; and
      a second selector that selects and outputs write data generated by the memory BIST circuit, when the test using the memory BIST circuit is performed, and selects and outputs write data generated by the CPU, when the test using the memory BIST circuit is not performed, and
   wherein the flip-flop includes:
      a first flip-flop that receives and samples an output of the first selector; and
      a second flip-flop that receives and samples an output of the second selector;
   the first flip-flop forming an access path of an address and control signal supplied to an address and control terminal of the memory and the second flip-flop forming an access path of write data supplied to a write data terminal of the memory.

2. The semiconductor device according to claim 1, comprising;
   a third flip-flop that receives and samples read data read from the memory, the read data output from the third flip-flop being supplied to the memory BIST circuit.

3. The semiconductor device according to claim 2, comprising:
   a test bus that transfers, for memory test, an address and control signal and write data to the memory and read data from the memory;
   a third selector that receives an address and control signal output from the first flip-flop and an address and control signal transferred from the test bus, and that selects the address and control signal transferred from the test bus, when a test using the test bus is performed, and selects the address and control signal output from the first flip-flop, when the test using the test bus is not performed, the address and control signal selected by the third selector being supplied to an address and control terminal of the memory; and
   a fourth selector that receives write data output from the second flip-flop and write data transferred from the test bus, and that selects the write data transferred from the test bus, when the test using the test bus is performed, and selects the write data output from the second flip-flop, when the test using the test bus is not performed, the write data selected by the fourth selector being supplied to a write data terminal of the memory.

4. The semiconductor device according to claim 3, comprising:
   a memory bypass circuit including:
      a fourth flip-flop that receives and samples write data output from the fourth selector; and
      a fifth selector that receives read data from the memory and an output of the fourth flip-flop, and that selects an output of the fourth flip-flop when the memory is bypassed and selects the read data from the memory when the memory is not bypassed, an output of the fifth selector being supplied to the third flip-flop.

5. The semiconductor device according to claim 1, wherein the first and second flip-flops function as pipeline flip-flops, when performing a test using the memory BIST circuit.

* * * * *